United States Patent
Park et al.

(10) Patent No.: US 7,507,674 B2
(45) Date of Patent: Mar. 24, 2009

(54) MEMORY DEVICE INCLUDING RESISTANCE CHANGE LAYER AS STORAGE NODE AND METHOD(S) FOR MAKING THE SAME

(75) Inventors: Yoon-Dong Park, Yongin-si (KR); Won-Joo Kim, Suwon-si (KR); Sang-Hun Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 298 days.

(21) Appl. No.: 11/270,565

(22) Filed: Nov. 10, 2005

(65) Prior Publication Data
US 2006/0110877 A1 May 25, 2006

(30) Foreign Application Priority Data
Nov. 10, 2004 (KR) ............... 10-2004-0091492

(51) Int. Cl.
*H01L 21/461* (2006.01)
(52) U.S. Cl. ............... 438/724; 438/947; 438/736; 438/696; 257/E21.038; 257/E21.039; 257/E21.036
(58) Field of Classification Search ................. 438/724, 438/947
See application file for complete search history.

(56) References Cited

U.S. PATENT DOCUMENTS

| 5,447,881 | A | * | 9/1995 | Ryou .................. 438/396 |
| 6,140,217 | A | * | 10/2000 | Jones et al. ............... 438/597 |
| 6,534,813 | B1 | * | 3/2003 | Park et al. ............... 257/300 |
| 6,759,707 | B2 | * | 7/2004 | Prall ............... 257/315 |
| 6,828,237 | B1 | * | 12/2004 | Chan et al. ............... 257/E21.039 |
| 6,955,961 | B1 | * | 10/2005 | Chung ............... 438/947 |
| 2006/0060914 | A1 | * | 3/2006 | Huo et al. ............... 257/321 |

FOREIGN PATENT DOCUMENTS

| KR | 2003-0093230 | 12/2003 |
| KR | 2004-00823344 | 9/2004 |

OTHER PUBLICATIONS

Office Action for corresponding Korean Application No. 10-2004-0091492 dated May 25, 2006 and English translation thereof.

* cited by examiner

*Primary Examiner*—Zandra Smith
*Assistant Examiner*—Sun M Kim
(74) *Attorney, Agent, or Firm*—Harness, Dickey & Pierce

(57) ABSTRACT

A method for manufacturing a memory device including a resistance change layer as a storage node according to example embodiment(s) of the present invention and a memory device made by the method(s) are provided. Pursuant to example embodiments of the present invention, the method may include stacking (sequentially or otherwise) a conductive material layer, a diode layer and a data storage layer on a bottom layer, forming a first material layer on the data storage layer, forming a first hole exposing the data storage layer in the first material layer, forming a first spacer with a second material layer on the sidewall of the first hole, filling the first hole with a third material layer and covering the first spacer; removing the first material layer, forming a second spacer with a fourth material layer on the sidewall of the first spacer; removing the third material layer, and forming a second hole exposing the bottom layer in a first stack structure using the first and second spacers as a mask. These operations may result in the formation of bit lines and word lines as described.

14 Claims, 13 Drawing Sheets

MEMORY DEVICE INCLUDING RESISTANCE CHANGE LAYER AS STORAGE NODE AND METHOD(S) FOR MAKING THE SAME

PRIORITY STATEMENT

This application claims priority under 35 U.S.C. § 119 of Korean Patent Application No. 10-2004-0091492, filed on Nov. 10, 2004, in the Korean Intellectual Property Office, the entire contents of which are incorporated herein by reference.

BACKGROUND OF THE INVENTION

1. Field of the Invention

Example embodiments of the present invention relate to a semiconductor device and to a method for manufacturing a semiconductor device, and more particularly, to a memory device and a method for manufacturing the memory device including a resistance change layer as a storage node.

2. Description of the Related Art

Consumer demand for highly integrated semiconductor devices has led to the miniaturization of a unit cell of a memory device. The miniaturization (e.g., scaling-down of a unit cell size) of a memory device may be closely related to the manufacturing process used for making the memory device(s). Therefore, one approach to reduce the size of a memory device may be to improve the manufacturing process for making the memory device(s).

Among various device elements that may constitute a unit cell of a memory device, scaling down the size of a device element in which a bit data may actually be written (for instance, a capacitor in the case of a dynamic random access memory device (DRAM) and/or a static random access memory device (SRAM) and, a magnetic tunnel junction (MTJ) cell in the case of a magnetic random access memory device (MRAM)) may be one method to advance the miniaturization in size of a memory device.

In an attempt to advance the size reduction, a memory device using a resistance change layer as a storage node may be used. Hereinafter, this type of memory device will be referred to as a "conventional memory device."

The following discussion of the embodiments of FIGS. 1-14 relates to conventional method(s) of forming conventional memory devices. FIG. 1 is a diagram showing a cell array of a conventional memory device. In FIG. 1, reference numerals 2, 4 and 6 may represent a word line, a resistance change cell and a bit line, respectively. Also, reference notation C may represent a unit memory cell including the word line 2, the bit line 6 and one resistance change cell 4. As illustrated in FIG. 1, each of the word lines 2 perpendicularly cross each of the bit lines 6, and at these crossing points, the resistance change cells 4 are inserted individually between the word line 2 and the bit line 6.

As noted, FIGS. 2 through 14 are diagrams illustrating a method of manufacturing a conventional memory device including the cell array as shown in FIG. 1.

Referring to FIG. 2, n+-type conductive impurities may be doped on a silicon-on-insulator (SOI) substrate A1 including a silicon substrate 10, a silicon oxide layer 12 and a first silicon layer 13 which may be sequentially stacked. At this time, the doping may be targeted on the first silicon layer 13, and the dose may be controlled to be greater than about $10^{20}/cm^3$. Reference numeral 14 in FIG. 3 may represent an impurity doped silicon layer of the SOI substrate A1 which may be obtained by the above-described doping process. Also, in FIGS. 2 and 3, the diagrams shown on the right side correspond to the diagrams shown on the left side, respectively. This specific corresponding arrangement of the diagrams is also applied to FIGS. 4 through 14. Particularly, in FIGS. 2-14, the diagram on the left is a cross-sectional view taken along a first plane and the diagram on the right is another cross-sectional view taken along a second plane orthogonally (e.g., at 90°) intersecting the first plane of a conventional memory device as described below.

Referring to FIG. 4, a second silicon layer 16 may be formed on the impurity doped silicon layer 14 through (for example) an epitaxial growth method. Then, n+-type impurity doping may be conducted on the second silicon layer 16, thereby forming an n+-type doping layer 16a as a bottom layer of the second silicon layer 16. FIG. 5 shows this n+-type doping layer 16a.

Next, referring to FIG. 5, p-type conductive impurities may be implanted onto the second silicon layer 16. As illustrated in FIG. 6, as a result of this ion implantation, a p-type doping layer 16b may be formed as a top layer of the second silicon layer 16. Through these sequential process steps, the second silicon layer 16 may become a PN junction layer, that is, a diode layer.

Referring to FIG. 7, a resistance change layer 18 may be formed on the second silicon layer 16. Although not illustrated, a photoresist layer may be formed on the resistance change layer 18 and may then be patterned in the form of a strip. See diagram on left side of FIG. 8. Afterwards, the resistance change layer 18, the second silicon layer 16 and the impurity doped silicon layer 14 may be sequentially etched by using (for example) a photoresist pattern as an etch mask. This etching may continue until the silicon oxide layer 12 may be exposed. See diagram on left side of FIG. 8. After the etching, the photoresist pattern may be removed. Through this etching, as shown in the diagram on the left side of FIG. 8, the resistance change layer 18, the second silicon layer 16 and the impurity doped silicon layer 14 may be patterned in the form of a strip. The patterned impurity doped silicon layer 14 may be used as a word line. Note that in FIG. 8, the diagram on the left side is a cross-sectional view taken along line 8-8' of the structure of FIG. 9, while the diagram on the right side is a cross-sectional view of the same structure taken along line 8b-8b' of FIG. 9. Stated differently, the first plane along line 8-8' is perpendicular to the second plane along line 8b-8b'.

FIG. 9 is a perspective view showing the above resulting substrate structure after the etching process. In particular, FIG. 9 clearly shows the change in the shape of the impurity doped silicon layer 14, the second silicon layer 16 and the resistance change layer 18 that may be made via the above-described etching process.

Referring to FIG. 10, after the etching process, a first interlayer insulating layer 22 may be formed on the exposed silicon oxide layer 12, covering patterned structures each including the patterned resistance change layer 18, the patterned second silicon layer 16 (16a and 16b) and the patterned impurity doped silicon layer 14. Subsequently, as shown in FIG. 11, the first interlayer insulating layer 22 may be planarized (removed) until a surface of the patterned resistance change layer 18 may be exposed. After the planarization process, the first interlayer insulating layer 22 may remain only at spaces 20, each present between the patterned structures. Also, the planarization process may cause (or lead to) the first interlayer insulating layer 22 to insulate the patterned structures from each other.

Referring to FIG. 12, a conductive layer 24 may be formed on the planarized first interlayer insulating layer 22 and the patterned resistance change layer 18. The conductive layer 24 may be used for forming bit lines.

To form bit lines perpendicular to the patterned impurity doped silicon layer 14, which may be used as a word line, the conductive layer 24 may be etched in the form of strips perpendicular to the patterned impurity doped silicon layer 14. This perpendicular orientation is illustrated on the right-side diagram of FIG. 13. This etching process may be used not only for etching the conductive layer 24 in the form of strips, but also for forming the patterned second silicon layer 16 and the patterned resistance change layer 18 as a part of a unit cell to obtain the cell array shown in FIG. 1. Hence, the etching process with respect to the conductive layer 24 may be performed not only until the patterned impurity doped silicon layer 14 may be exposed, but until the silicon oxide layer 12 may be exposed to yield the pattern shown in FIG. 13. Note that as shown in the diagram on the left side of FIG. 13, the patterned impurity doped silicon layer 14 may be etched down to the top of the silicon dioxide layer 12; whereas, as shown in the diagram on the right side of FIG. 13, the patterned impurity doped layer 14 remains intact above the silicon oxide layer 12. Through this etching process, the conductive layer 24 may be patterned in the form of strips, that is, the bit lines (e.g., of layer 24) may be formed in a perpendicular orientation to the patterned impurity doped silicon layer 14. Also, the patterned second silicon layer 16 and the patterned resistance change layer 18 may exist at a region where the patterned impurity doped silicon layer 14 and the patterned conductive layer 24 may make contact with each other. In other words, layers 16 and 18 may be sandwiched between layers 14 and 24 as shown.

Referring to FIG. 14, a second interlayer insulating layer 26 may be formed over the patterned conductive layer 24 by filling spaces created between the patterned conductive layer 24 as shown. Through these sequential processes, the cell array shown in FIG. 1 may be completely formed.

The conventional memory device manufactured through the above-described manufacturing method may use the resistance change layer for writing bit data. Although this use of the resistance change layer may improve the miniaturization of a memory device, this above-described conventional method (of FIGS. 1-14) may still have difficulty in scaling down the unit cell size to less than about $4F^2$ (F=45 nm).

SUMMARY

The description below refers to various example embodiments of the present invention. Thus, the same is implied without having to recite (each time) the statement "according to example embodiment(s) of the present invention."

Nevertheless, according to an example embodiment of the present invention, a method of manufacturing a miniaturized memory device is provided. According to another example embodiment of the present invention, the size of the unit cell (that may include a resistance change layer as a storage node) may be reduced to below about $4F^2$ (e.g., about $F^2$ or less).

Note that while the steps noted herein below are labeled by letters, the steps may be performed in the order listed or in any other suitable order according to example embodiments of the invention. Merely labeling the steps by letter designations alone does not necessarily imply the order listed. Of course, according to an example embodiment of the present invention, the listed order may also be followed. Pursuant to an example embodiment of the present invention, there is provided a method of manufacturing a memory device, wherein data may be stored in a region at which a word line and a bit line may cross with each other, the method comprising: (a) stacking a conductive material layer, a diode layer and a data storage layer on a bottom layer (so that, for example, the layers may be in the order of a bottom layer, conductive material layer, a diode layer and a data storage layer at the top; see, for example, the embodiment of FIG. 17 discussed in greater detail below); (b) forming a first material layer on the data storage layer; (c) forming a first hole in the first material layer, for example, in the form of a strip (or other suitable shape or form), the hole exposing the data storage layer; (d) forming a first spacer with a second material layer on the sidewall of the first hole; (e) filling the first hole with a third material layer covering the first spacer; (f) removing the first material layer; (g) forming a second spacer with a fourth material layer on the sidewall of the first spacer exposed as the first material layer is removed; (h) removing the third material layer; and (i) forming a second hole, for example, in the form of a strip (or other suitable shape or form) in a first stack structure including the conductive layer, the diode layer and the data storage layer using the first and second spacers as a mask, the second hole exposing the bottom layer.

Pursuant to an example embodiment of the present invention, the bottom layer may be formed by sequentially stacking a substrate and a buffer layer.

Pursuant to an example embodiment of the present invention, the forming of the conductive material layer may comprise: forming a semiconductor layer on the buffer layer; and doping conductive impurities onto the semiconductor layer.

Pursuant to an example embodiment of the present invention, the forming of a first hole may further comprise: forming a hard mask including an opening on the first material layer, the opening being patterned in the form of a strip and having a width of about 1F; and etching a portion of the first material layer exposed through the opening until the data storage layer is exposed.

Pursuant to an example embodiment of the present invention, the filling a first hole may further comprise: forming the third material layer filling the first hole on the first material layer; and planarizing the third material layer until the first material layer may be exposed.

Pursuant to an example embodiment of the present invention, the forming a second spacer may further comprise: forming the fourth material layer covering the first spacer and the third material layer on the data storage layer exposed as the first material layer is removed; and performing an anisotropic etching process on the upper surface of the fourth material layer until the data storage layer and the third material layer may be exposed.

Pursuant to an example embodiment of the present invention, the forming a first spacer may further comprise: forming the second material layer covering the sidewall and the bottom of the first hole on the first material layer; and performing an anisotropic etching process on the second material layer until the first material layer may be exposed.

Pursuant to an example embodiment of the present invention, the second and fourth material layers may be formed in a thickness less than about 1F (less than about 45 nm).

According to other example embodiment(s) of the present invention, the method may further comprise: (j) removing the first and second spacers; (k) filling the second holes exposing the bottom layer with a first insulation layer; (l) forming a conductive layer on the data storage layer and on the first insulation layer filling the second hole; (m) forming third and fourth spacers on the conductive layer through the operations (b) through (h), the third and fourth spacers being substantially equal to the first and second spacers, respectively and crossing perpendicular to the first and second spacers; (n) forming third holes in a second stack structure including the diode layer, the data storage layer and the conductive layer using the third and fourth spacers as a mask, the third holes exposing the conductive material layer; (o) removing the third and fourth spacers; and (p) filling the third holes exposing the conductive material layer with a second insulation layer.

In the forming the third and fourth spacers, each material layer for forming the third and fourth spacers may be formed in a thickness of less than about 1F.

According to other example embodiment(s) of the present invention, the method may further comprise: (q) forming another buffer layer covering the second insulation layer on the conductive layer; and (r) repeating the operations (a) through (p) using the another buffer layer as the bottom layer.

BRIEF DESCRIPTION OF THE DRAWINGS

Example embodiments of the present invention will be more clearly understood from the following detailed description taken in conjunction with the accompanying drawings.

FIGS. 15 through 33 are cross-sectional views illustrating a conventional method of manufacturing a memory device (using a resistance change layer as a storage node) according to example embodiments of the present invention; and FIG. 34 shows a cross-sectional view of a multi-layer nonvolatile memory device structure made by the example embodiment(s) of one or more of FIGS. 15-33 as described herein.

DETAILED DESCRIPTION OF EXAMPLE EMBODIMENTS OF THE PRESENT INVENTION

Figure 1:
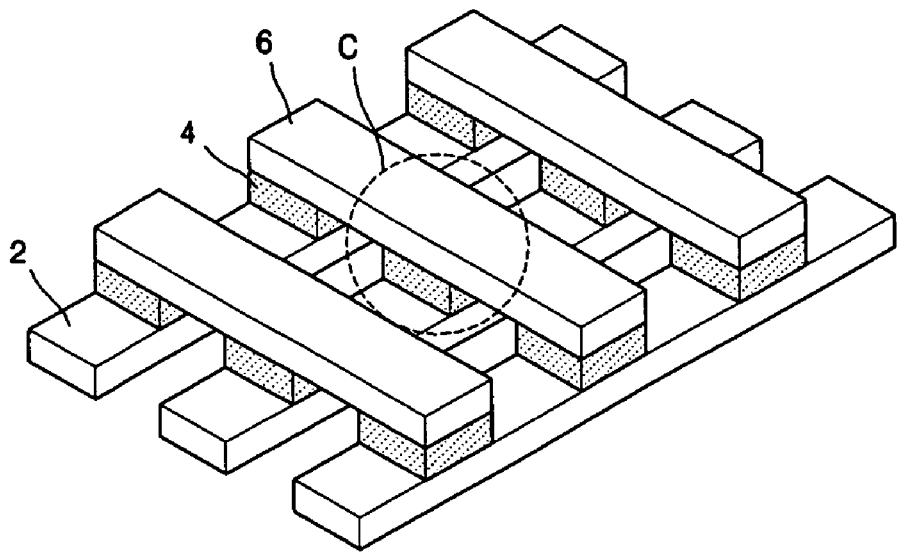
FIG. 1 is a perspective view showing a cell array of a conventional memory device using a resistance change layer as a storage node.
Figure 2:
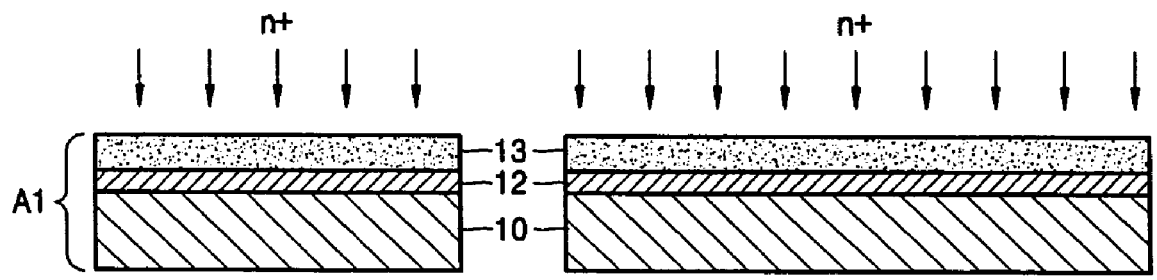
FIGS. 2 through 14 are diagrams illustrating a method of manufacturing a conventional memory device including the cell array shown in FIG. 1.
Figure 3:
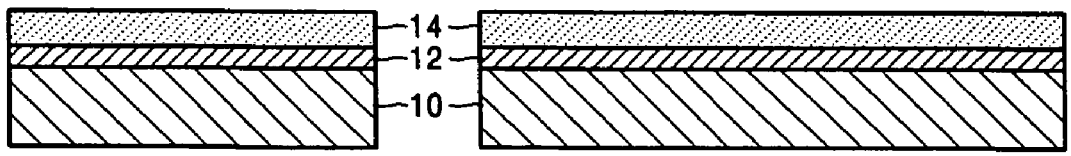
Figure 4:
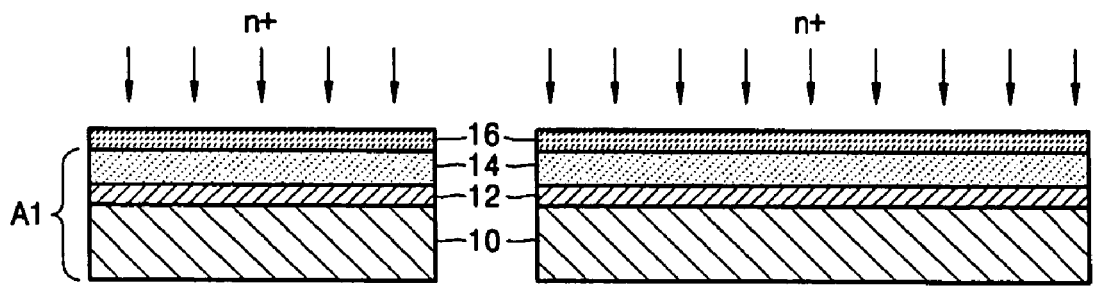
Figure 5:
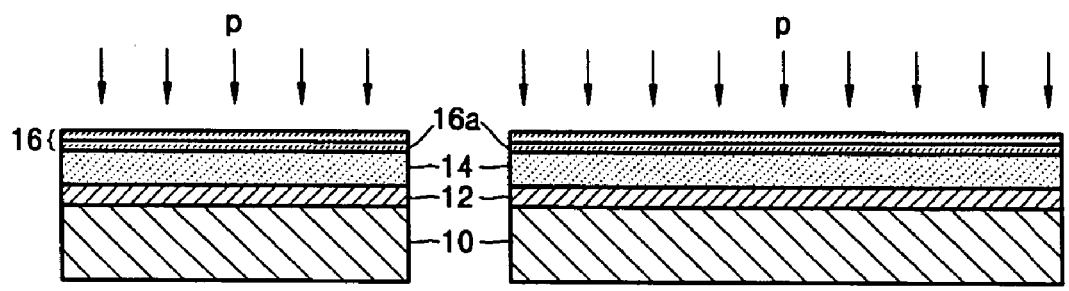
Figure 6:
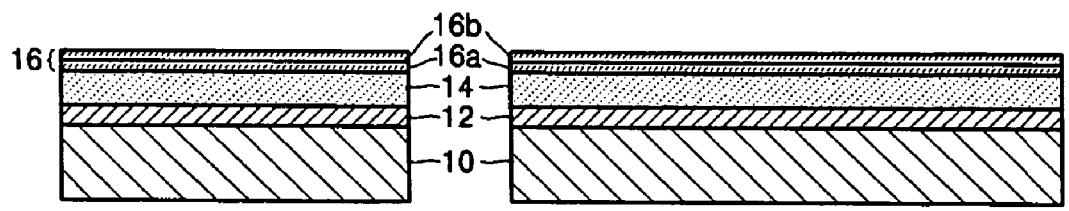
Figure 7:
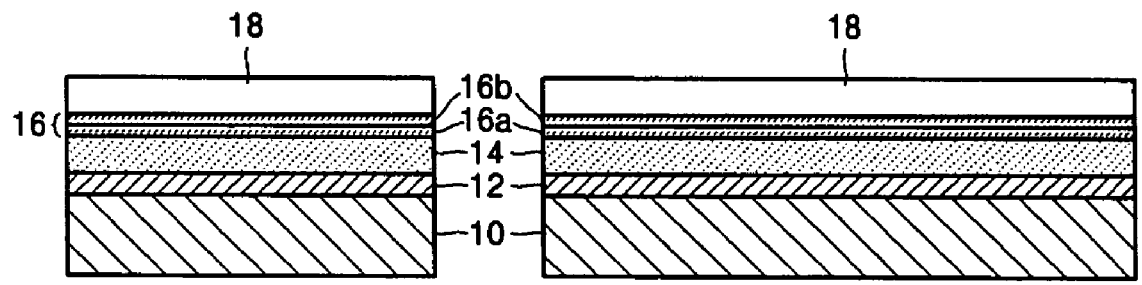
Figure 8:
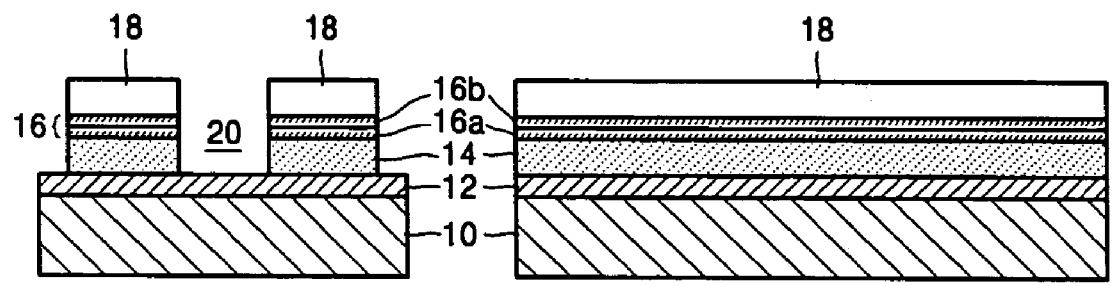
Figure 9:
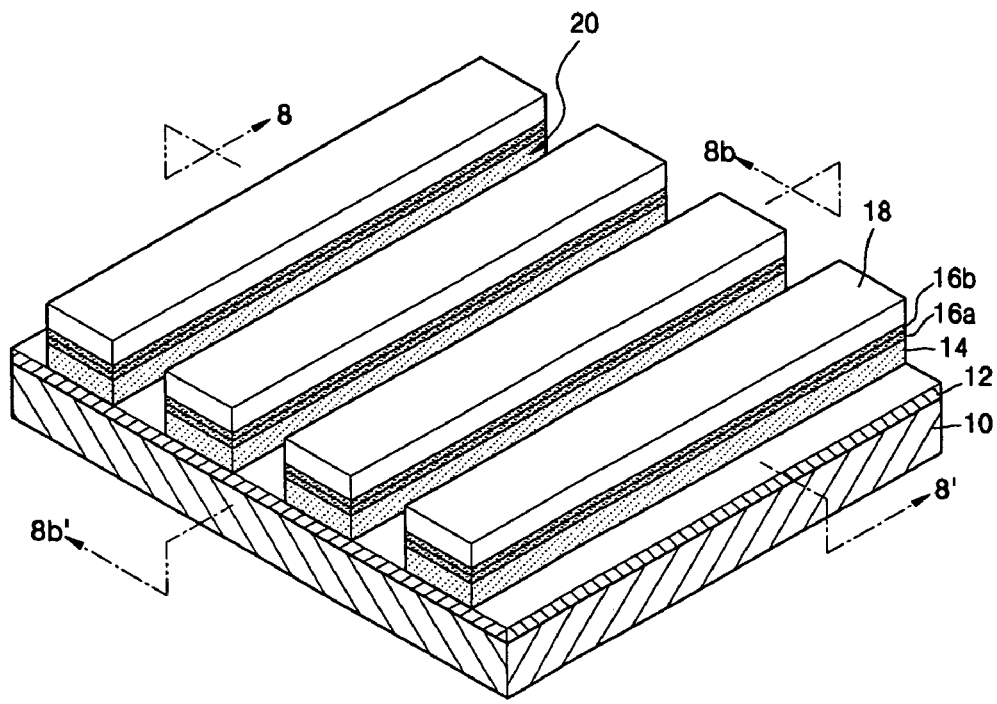
Figure 10:
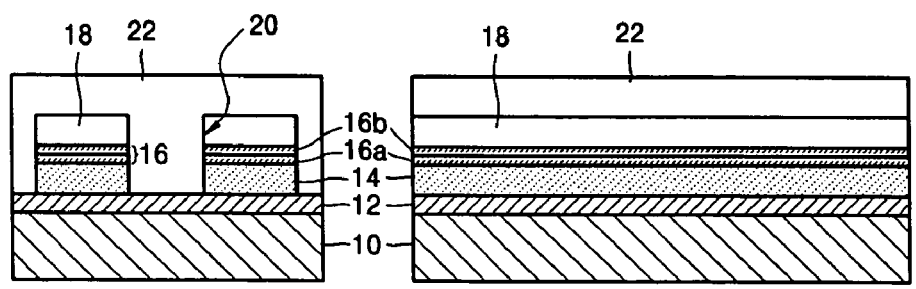
Figure 11:
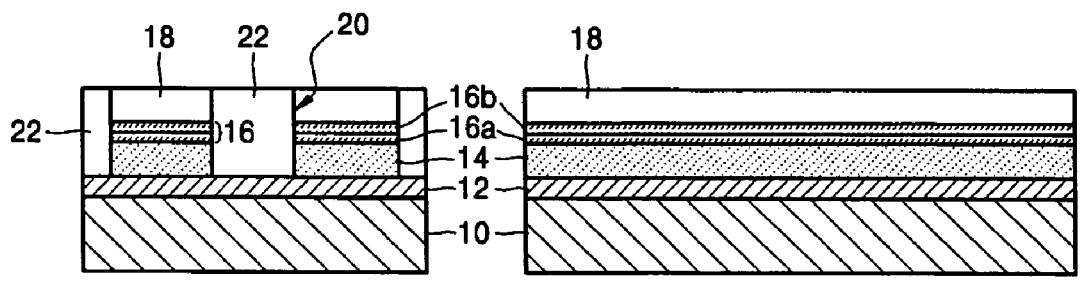
Figure 12:
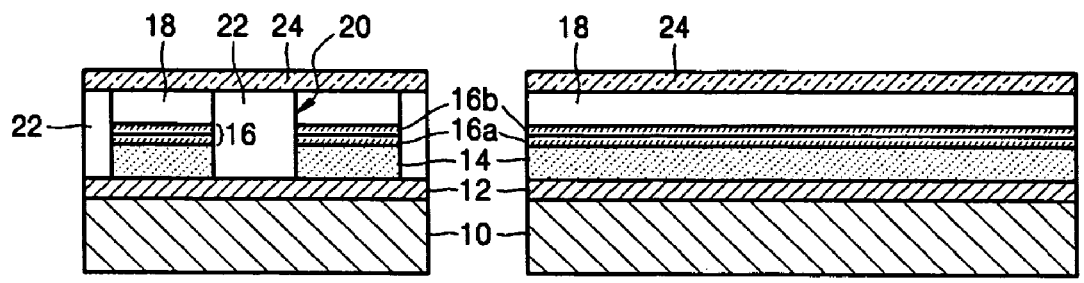
Figure 13:
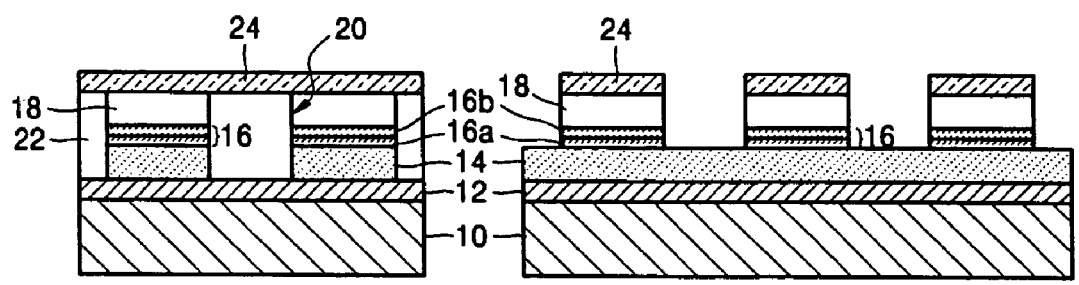
Figure 14:
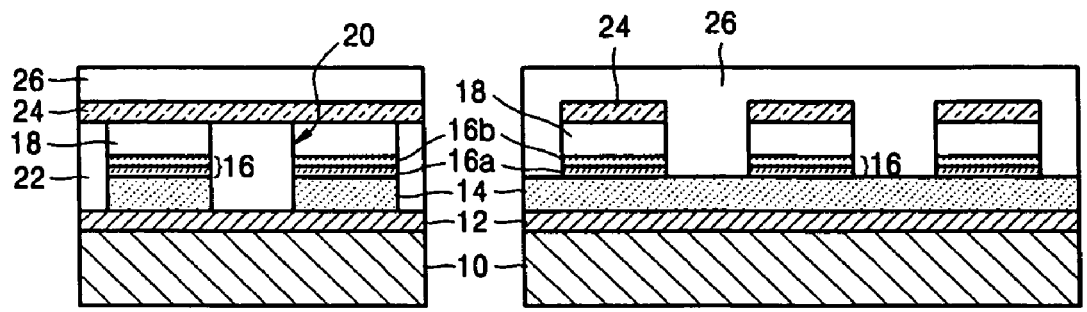

Various example embodiments of the present invention will now be described more fully with reference to the accompanying drawings in which some example embodiments of the invention are shown. In the drawings, the thicknesses of layers and regions may be exaggerated for clarity.

Detailed illustrative example embodiment(s) of the present invention are disclosed herein. However, specific structural and functional details disclosed herein are merely representative for purposes of describing example embodiment(s) of the present invention. This invention may, however, may be embodied in many alternate forms and should not be construed as limited to only the embodiment(s) set forth herein.

Accordingly, while example embodiment(s) of the invention are capable of various modifications and alternative forms, embodiment(s) thereof are shown by way of example in the drawings and will herein be described in detail. It should be understood, however, that there is no intent to limit example embodiment(s) of the invention to the particular forms disclosed, but on the contrary, example embodiment(s) of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiment(s) only and is not intended to be limiting of example embodiment(s) of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Hereinafter, a detailed description of a method of manufacturing a memory device (which may include a resistance change layer as a storage node) according to example embodiment(s) of the present invention is provided with reference to the accompanying drawings. Specifically, a nonvolatile memory device manufacturing method may be exemplified in example embodiment(s) and, hereafter may be referred to as "a memory device manufacturing method". Also, as noted above, illustrated layers and their thicknesses may be relatively exaggerated for clarity. Furthermore, in each FIG. (where left and right diagrams are provided), the diagram shown on the right side corresponds to a structure shown in the diagram depicted on the left side of the same FIG. or drawing.

Figure 15:
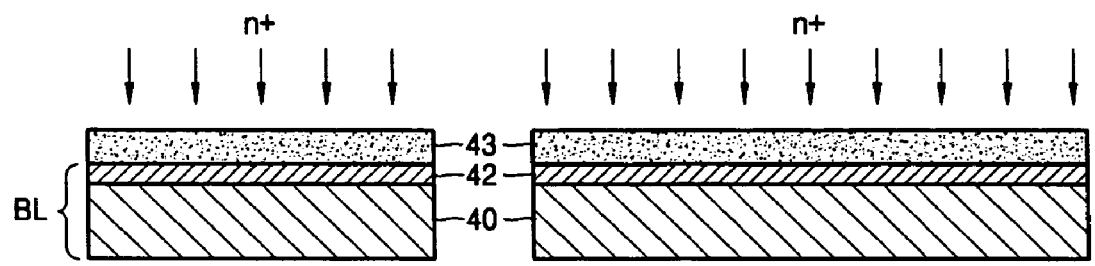
FIGS. 15-34 represent non-limiting examples, embodiments and/or intermediates of the present invention as described herein.

Referring to the example embodiment of FIG. 15 of the present invention, a semiconductor layer 43 may be formed on a semi-finished bottom layer BL (BL of, for example, a substrate layer 40 and a buffer layer 42), and then conductive impurities, for instance, n+-type conductive impurities, may be doped onto the semiconductor layer 43. The semi-finished bottom layer BL may be formed by sequentially stacking a substrate 40 and a buffer layer 42. The bottom layer BL and the semiconductor layer 43 construct form a structure referred to as a silicon-on-insulator (SOI) type structure. Silicon is an example of a material that may be used for forming the substrate layer 40. Other suitable substrate layer materials may be used.

According to an example embodiment of the present invention, the buffer layer 42 may serve a role in maintaining adhesion between the substrate 40 and the semiconductor layer 43 and may serve a further role in buffering a discrepancy in thermal expansion coefficients of layers 40 and 43. Therefore, pursuant to an example embodiment of the present invention, the thermal expansion coefficient of the buffer layer 42 may be an approximate median value of that of the substrate 40 and that of the semiconductor layer 43. The buffer layer 42 may be formed of silicon oxide ($SiO_2$). Other suitable buffer layer materials may be used. According to further example embodiments of the present invention, the semiconductor layer 43 may be formed of the same material used for forming the substrate 40. That is, the semiconductor layer 43 may utilize silicon. Other suitable semiconductor layer materials may be used.

Figure 16:
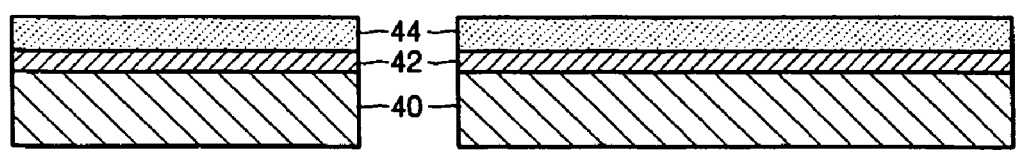

According to an example embodiment of the present invention, FIG. 16 shows a substrate structure resulting from the above-described n+-type impurity doping of the semiconductor layer 43. Reference numeral 44 refers to an example embodiment (of the present invention) of a n+-type impurity doped semiconductor layer.

Figure 17:
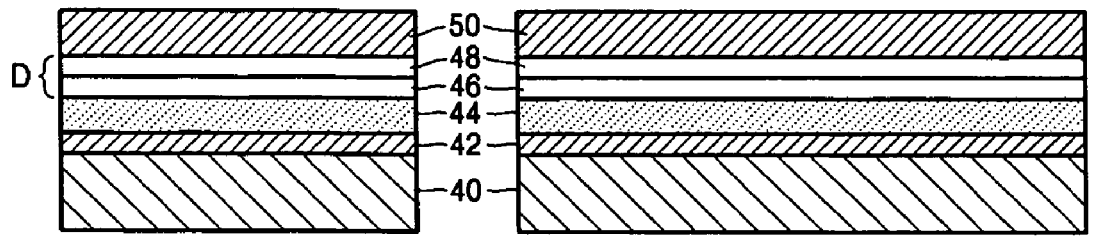

Referring to the example embodiment(s) of FIG. 17 of the present invention, a first semiconductor layer 46 may be formed on the n+-type impurity doped semiconductor layer 44 and the first semiconductor layer 46 may then be doped with conductive impurities, for example, n+-type conductive impurities. Afterwards, a second semiconductor layer 48 may be formed on the first semiconductor layer 46 and the second semiconductor layer 48 may then be doped with conductive impurities, for example, p-type conductive impurities. Through these (example embodiment) sequential impurity doping processes, a PN diode layer D may be formed on the n+-type impurity doped semiconductor layer 44. The first semiconductor layer 46 and the second semiconductor layer 48 may be formed through applying an epitaxial growth method. Other suitable methods may be used. Subsequent to the formation of the PN diode layer D, a resistance change layer 50 may be formed on the second semiconductor layer 48 doped with p-type impurities. The resistance change layer 50 may be used as a storage node for storing bit data. Materials such as polymers, metal oxides and the like may be employed for forming the resistance change layer 50. Other suitable materials may be used.

In an example embodiment, the resistance change layer 50 may include a chalcogenide.

In the case that the resistance change layer 50 may be a polymer-based layer, various types of materials may be used for a polymer memory device and materials including (but not limited to) germanium (Ge), antimony (Sb) and tellurium (Te) may also be used.

For example, the resistance change layer 50 may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the resistance change layer 50 may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the resistance change layer 50 may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the resistance change layer 50 is described above as being formed primarily of ternary phase-change chalcogenide alloys, the chalcogenide alloy of the resistance change layer 50 could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

These Ge, Sb, and/or Te materials may cause phase-transition in a phase-transition random access memory device (PRAM) and may be employed for that purpose. Herein, the latter mentioned Ge, Sb and Te may be abbreviated as GST. In the case that the resistance change layer 50 may be a metal-oxide-based layer, a material of transition-metal-oxide (TMO) selected from the group consisting of strontium zirconate ($SrZrO_3$), strontium titanate ($SrTiO_3$), nickel oxide ($NiO_x$; e.g., $NiO_2$), titanium oxide ($TiO_x$; e.g., $TiO_2$), and niobium oxide ($Nb_yO_x$; $Nb_2O_5$) may be employed. The value of "x" may vary from 1 to about 5, and the value of "y" may vary from 1 to about 3, as appropriate.

In an example embodiment, the resistance change layer 50 may be formed of transition metal oxide that includes at least one material of nickel oxide (NiO), titanium oxide ($TiO_2$), hafnium oxide (HfO), niobium oxide ($Nb_2O_5$), zinc oxide (ZnO), zirconium oxide ($ZrO_2$), tungsten oxide ($WO_3$), cobalt oxide (CoO), GST ($Ge_2Sb_2Te_5$), and PCMO ($Pr_xCa_{1-x}MnO_3$).

Figure 18:
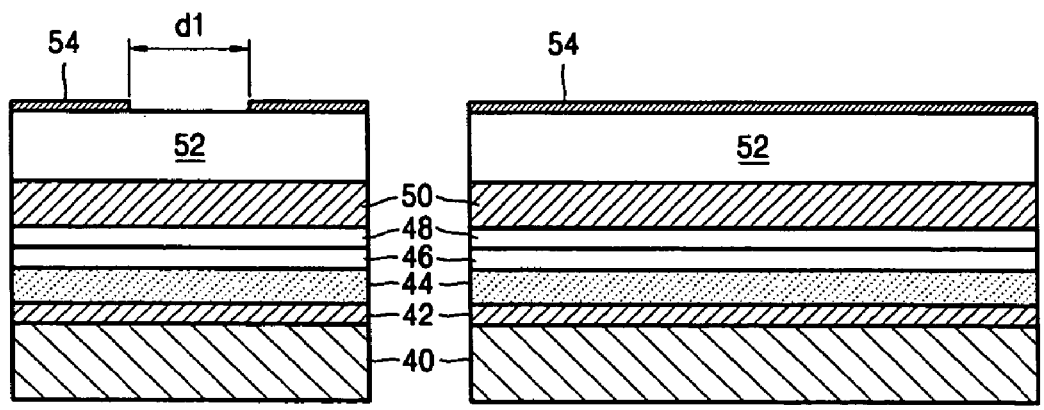

Referring to the example embodiment(s) of FIG. 18 of the present invention, a first material layer 52 may be formed on the resistance change layer 50. The first material layer 52 may be formed of a material that has a sufficient etch selectivity ratio with respect to the resistance change layer 50. In other words, under the influence of the same etching agent and/or etching conditions, the material of the first material layer 52 etches easier and/or faster than the etching of the resistance change layer 50. Silicon oxide is an example of a material suitable for forming the first material layer 52. Other suitable layer 52 materials may be used. A hard mask 54 including an opening "d1" that exposes a portion of the first material layer 52 may be formed (and/or placed) on the first material layer 52. The opening "d1" may be patterned in the form of a strip (or other suitable form or shape) of a width which is about 1F. Since the hard mask 54 may be used as a mask during one or more subsequent etching process steps performed on the first material layer 52, the hard mask 54 may be made of a material that provides a lower etch selectivity ratio than that of the first material layer 52. In other words, under the influence of the same etching agent and/or etching conditions, the material used for the hard mask layer 54 etches less readily and/or slower than that etching of the first material layer 52.

Figure 19:
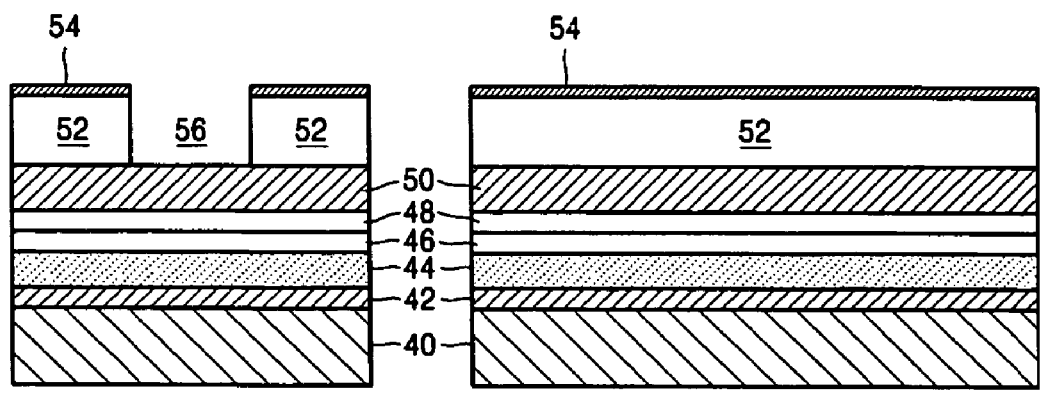

According to other example embodiment(s) of the present invention, next, a first anisotropic etching may be applied to the entire hard mask 54 by using an etchant which has a higher etch selectivity ratio with respect to the first material layer 52. The first anisotropic etching may be carried out until the resistance change layer 50 may be exposed. The example embodiment(s) of FIG. 19 of the present invention show a substrate structure resulting from the above-described first anisotropic etching process. According to an example embodiment of the present invention, the first anisotropic etching process may remove a portion of the first material layer 52 exposed within the opening(s) "d1" of the hard mask 54, thereby forming a first hole 56 exposing a portion of the resistance change layer 50. Pursuant to example embodiment(s) of the present invention, the hard mask 54 may be removed thereafter. The first hole 56 may also be patterned in the form of a strip. Other suitable forms or shapes may be used.

Figure 20:
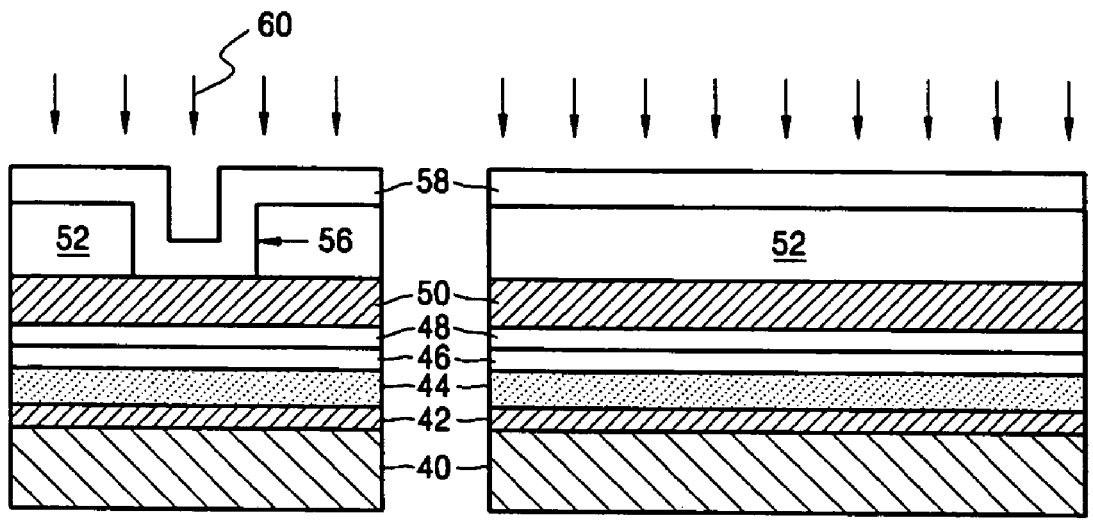

Referring to the example embodiment(s) of FIG. 20 of the present invention, a second material layer 58 may be formed in a desired thickness over the etched first material layer 52 filling the bottom and sidewalls of the first hole 56. In consideration that a width of the first hole 56 may be identical to that of the opening "d1", the second material layer 58 may be formed in a thickness less than the width of the opening "d1" (which opening "d1" is about 1F wide). For instance, a possible thickness of the second material layer 58 may be about F/3. Other suitable thicknesses may be used. Also, the second material layer 58 may have a etch selectivity ratio with respect to the first material layer 52 and the resistance change layer 50. The second material layer 58 may be formed of a nitride-based material such as silicon nitride ($Si_yN_x$; e.g., $Si_3N_4$). Other suitable materials may be used. After the formation of the second material layer 58, a second anisotropic etching process 60 may be conducted until surfaces of the first material layer 52 and the resistance change layer 50 may be exposed. See, for example, FIGS. 20-21.

Figure 21:
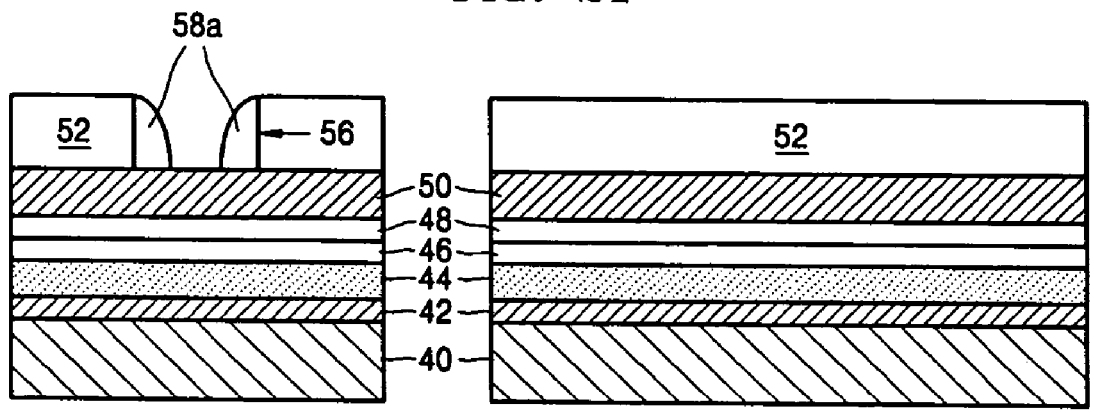

As a result of the second anisotropic etching process 60, portions of the second material layer 58 disposed on the first material layer 52 and at the bottom of the first hole 56 may be removed. This resulting substrate structure may be as illustrated in FIG. 21. A reference numeral 58a denotes a first spacer covering each sidewall of the first hole 56, according to example embodiment(s) of the present invention.

Figure 22:
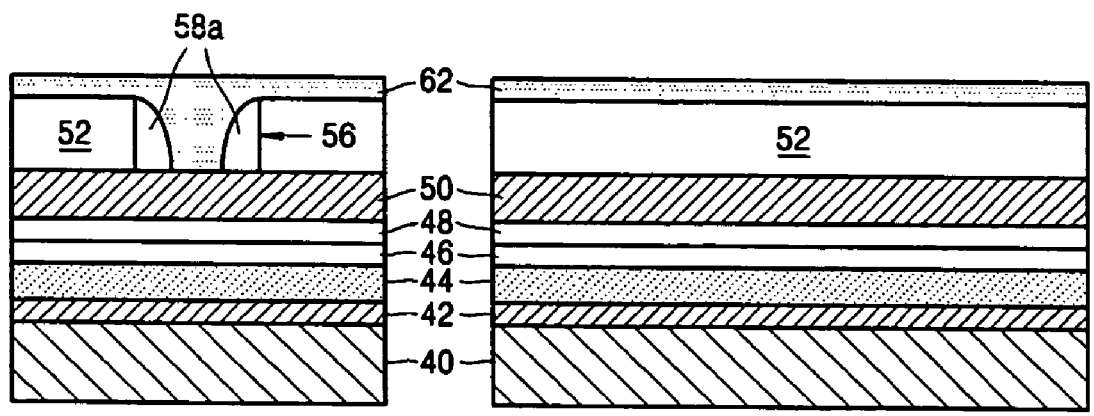
Figure 23:
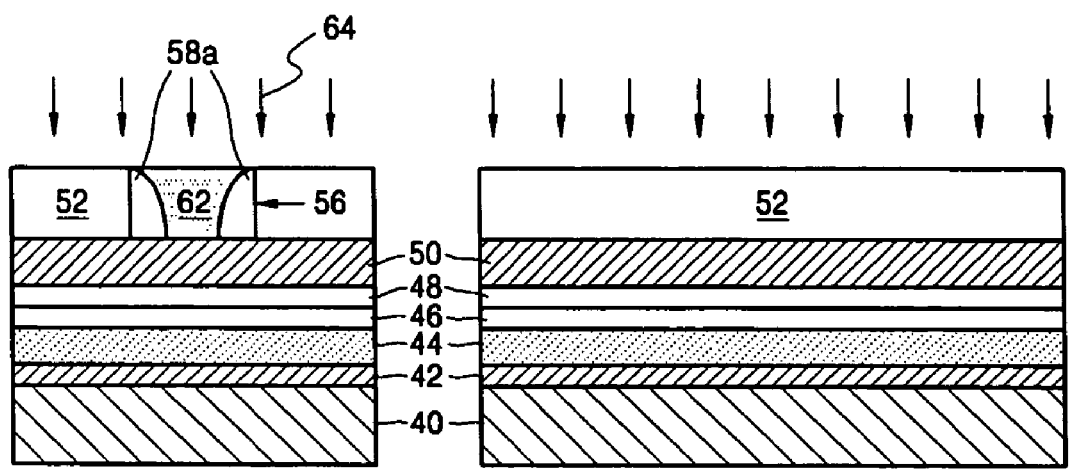

Referring to the example embodiment(s) of FIG. 22 of the present invention, a third material layer 62 covering the first spacers 58a and filling the first hole 56 may be formed over the etched first material layer 52. The third material layer 62 may be formed of a material having a desired etch selectivity ratio with respect to the first material layer 52 and the first spacers 58a. A nitride that provides a low etch selectivity ratio in comparison with that of the first material layer 52 and/or the first spacers 58a may be used as (according to an example embodiment of the present invention) a material suitable for use as the third material layer 62. Other suitable materials may be used. After the third material layer 62 may be formed, a planarization process may be conducted until the first material layer 52 may be exposed. The planarization process may include one of a chemical mechanical polishing (CMP) process and/or an etch-back process. Other suitable planarization processes may be used. Example embodiment(s) of FIG. 23 of the present invention show a planarized substrate structure after the aforementioned planarization process has been conducted. In particular, the third material layer 62 may remain inside of the first hole 56 overlaid with the first spacers 58a. Also, because the first hole 56 may be patterned in the form of a strip (or other suitable) form or shape, the remaining portion of the third material layer 62 may also be formed in the same strip (or other suitable) form or shape.

Figure 24:
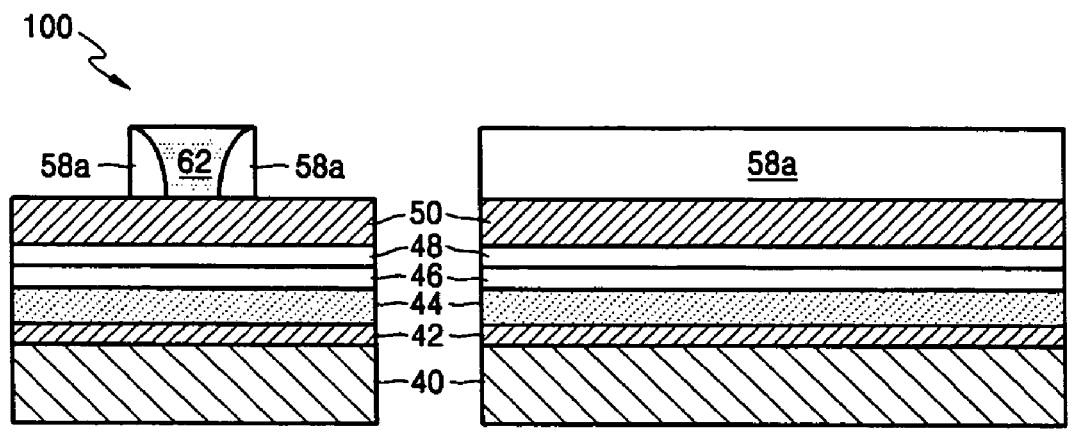

According to example embodiment(s) of the present invention, next, a third anisotropic etching process 64 may be conducted on the above-described entire planarized structure. The third anisotropic etching process 64 may be carried out (by using an etchant that provides a high etch selectivity ratio with respect to the first material layer 52 according to an example embodiment of the present invention) until the resistance change layer 50 may be exposed. Since the third material layer 62 filling the first hole 56 may be made of a material which may have an etch selectivity ratio that may be lower than that of the first material layer 52, the third anisotropic etching process 64 may hardly affect the third material layer 62. Also, because the remaining portion of the third material layer 62 shields the first spacers 58a, the first spacers 58a may not be affected by the third anisotropic etching process 64. As a result of the third anisotropic etching process 64, as shown in the example embodiment(s) of FIG. 24 of the present invention, the first material layer 52 adjacent to the individual first spacer(s) 58a may be selectively removed, thereby exposing portions of the resistance change layer 50 that may be disposed beneath the removed first material layer 52. Also, the removal of the first material layer 52 may cause the first hole 56 to be eliminated as well because the first material layer 52 may no longer be present (as depicted) and needed to define the boundaries of a first hole 56. Hence, these sequential removal steps may result in the formation of a first stack structure 100 including a pair of the first spacers 58a and the remaining third material layer 62 filling the space between a pair of the first spacers 58a (as shown in the example embodiment(s) of FIG. 24 of the present invention).

Figure 25:
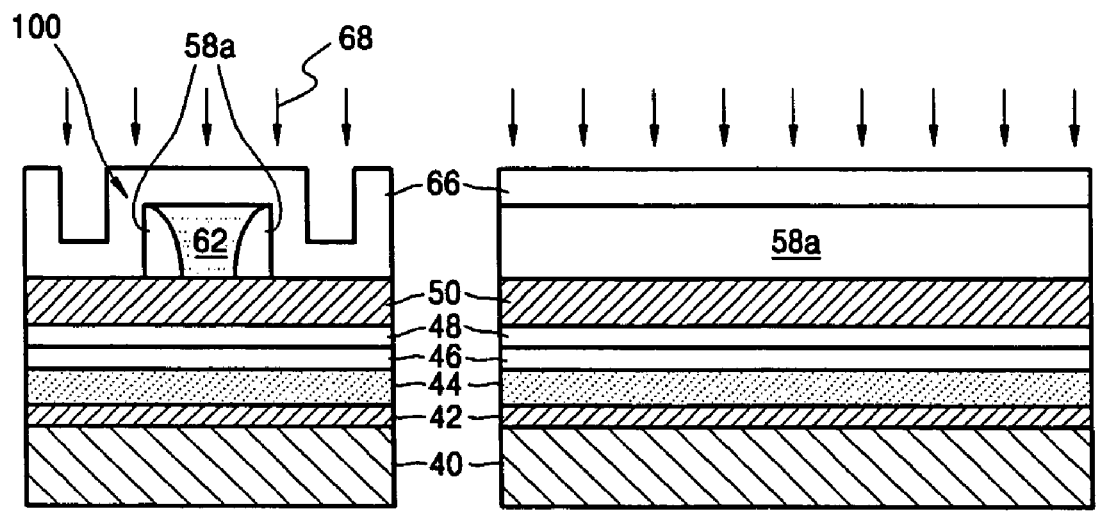
Figure 26:
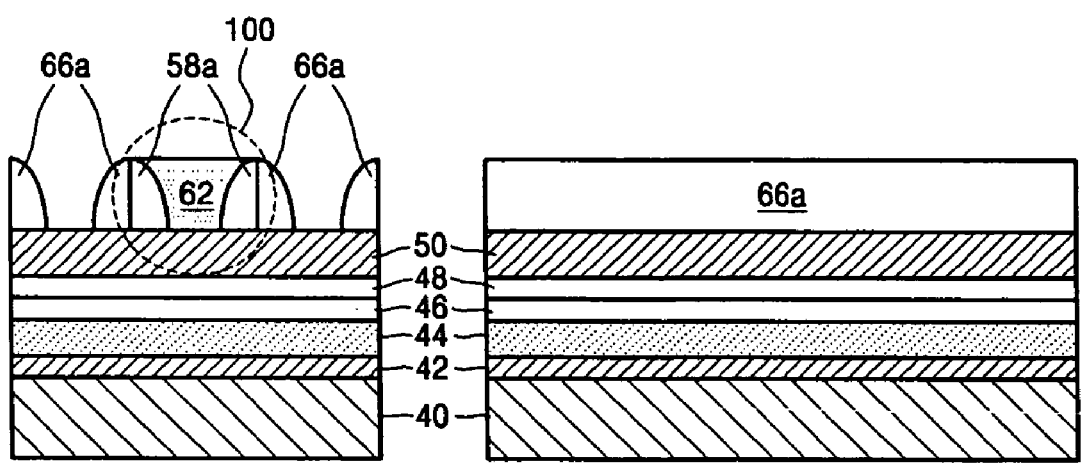

Referring to the example embodiment(s) of FIG. 25 of the present invention, a fourth material layer 66 may be formed over the exposed resistance change layer 50, covering the first stack structure 100 patterned in strip form. Although the fourth material layer 66 may be formed by employing the same material which may be used for forming the second material layer 58 (a source material for the first spacers 58a), the fourth material layer 66 may be formed of a material that may be different from the second material layer 58 but having similar or identical characteristics as that of the second material layer 58. Also, a thickness of the fourth material layer 66 may be about F/3 according to an example embodiment of the present invention. Afterwards, the fourth material layer 66 may be subjected to a fourth anisotropic etching process 68 employing an etchant with a high etch selectivity ratio for the fourth material layer 66. The fourth anisotropic etching process 68 may be continued until the resistance change layer 50 may be exposed. According to the example embodiment(s) of FIG. 26 of the present invention, FIG. 26 depicts a resulting substrate structure obtained after the fourth anisotropic etching process 68 may be completed. As depicted in FIG. 26, a plurality of second spacers 66a covering the sidewalls of the first stack structure 100 (that is, contacting the first spacers 58a) may be formed, and the resistance change layer 50 may be exposed at each region defined between the second spacers 66a.

Figure 27:
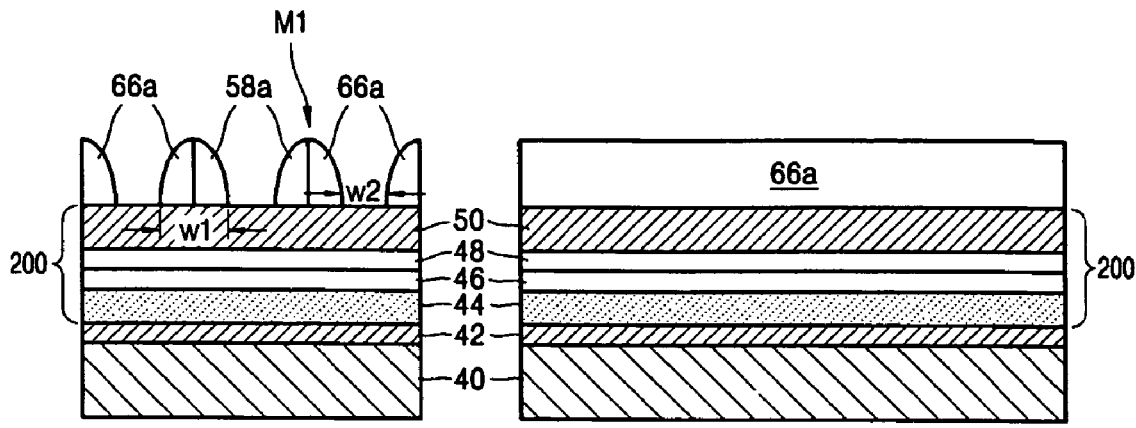

Referring to the example embodiment(s) of FIG. 27 of the present invention, the third material layer 62 remaining between the pair of the first spacers 58a may be removed and, as a result, a plurality of first mask pattern(s) M1 may be formed on portions of the resistance change layer 50. Each of the first mask pattern(s) M1 may include the first spacer 58a and the second spacer 66a.

Since the first spacer 58a and the second spacer 66a individually may have the width of about F/3, the individual elements of first mask pattern(s) M1 may have a width "w1" that is about (⅔)F (e.g., F/3+F/3=(⅔)F). The first mask pattern(s) M1 may determine the width of a unit cell of a square-shaped memory device. So, for example, the width of the unit cell may be about (⅔)F. Also, considering that both the second material layer 58 and the fourth material layer 66 may have the thickness of approximately F/3, a width between the first spacers 58a and that between the second spacers 66a, that is, the width "w2" between the first mask pattern(s) M1, will be about F/3 (e.g., if "d1"=F, and "w1"=(⅔)F, then "w2"="d1"−"w1"=F−(⅔)F=F/3). Etching the layers disposed beneath the first mask pattern(s) M1 (used as an etch mask) may result in the formation of word lines each with a width of approximately (⅔)F and spacers with a width of approximately F/3 in between the word lines. Furthermore, bit lines may be formed through the same processes applied to form the word lines. Hence, it may be possible to form a unit cell including the word line, the bit line and the spacers within an area of approximately $1F^2$.

Hereinafter, processes subsequent to the formation of the first mask pattern(s) M1 will be described in detail with reference to the example embodiment(s) of FIG. 28 of the present invention. Although not illustrated, a fifth anisotropic etching process may be performed on the exposed portions of the resistance change layer 50 by using the first mask pattern(s) M1 as an etch mask. The fifth anisotropic etching process may be conducted until the buffer layer 42 may be exposed. Hence, the second material layer 58 and the fourth material layer 66 (which are source materials for the first spacers 58a and the second spacers 66a, respectively), may be formed of material(s) that have an etch selectivity ratio lower than that of the resistance change layer 50, the first semiconductor layer 46, the second semiconductor layer 48, and/or the n+-type impurity doped semiconductor layer 44.

The fifth anisotropic etching process using the first mask pattern(s) M1 as an etch mask may be used to form second holes 90 penetrating into a second stack structure 200 (of example embodiment(s) of FIG. 27 of the present invention) including the n+-type impurity doped semiconductor layer 44, the first semiconductor layer 46, the second-semiconductor layer 48, and the resistance change layer 50. The second holes 90 may be patterned in strip form or shape and may expose the buffer layer 42. Other suitable forms or shapes may be used.

Figure 28:
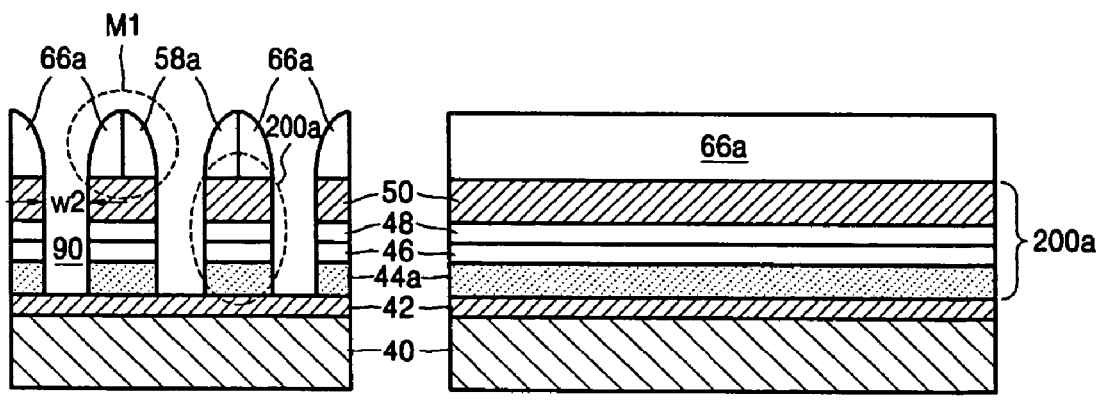

As illustrated in the example embodiment(s) of FIG. 28 of the present invention, as the second holes 90 may be formed into the second stack structure 200, the second stack structure 200 may be divided into a number of first stack pattern(s) 200a in the form of strips. Other suitable forms or shapes may be used. A patterned n+-type impurity doped semiconductor layer 44a included in each of the first stack patterns 200a may become the word line. After the formation of the second holes 90, the first mask pattern(s) M1 may be removed.

Figure 29:
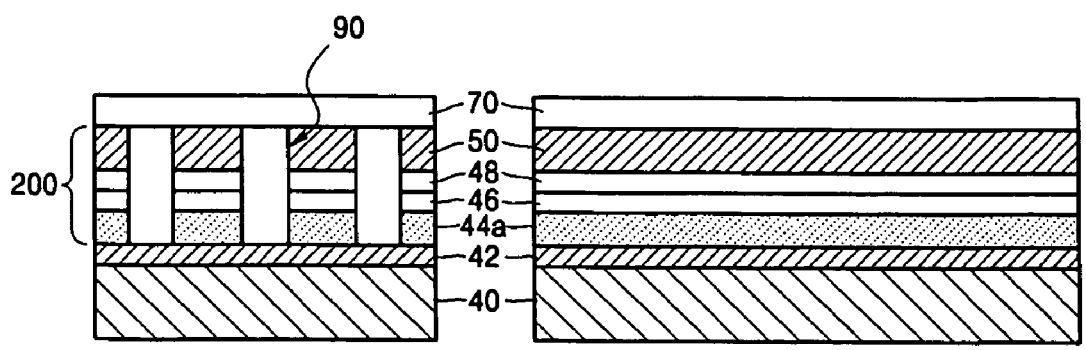

Referring to the example embodiment(s) of FIG. 29 of the present invention, a first interlayer insulating layer 70 filling the second holes 90 may be formed over the first stack pattern(s) 200a and may then be planarized until a surface of the resistance change layer 50 may be exposed. Although the planarization process may utilize a CMP process, an etch-back process may still be applied. Other suitable planarization processes may be used. As a result of this planarization process, the first interlayer insulating layer 70 may remain inside of the second holes 90.

Figure 30:
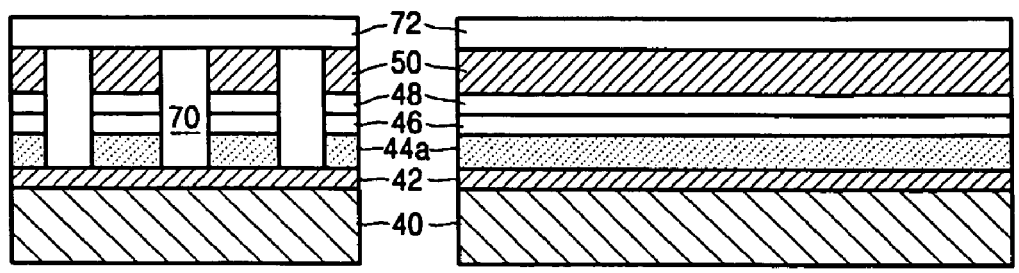

Referring to the example embodiment(s) of FIG. 30 of the present invention, a conductive layer 72 may be formed on the resistance change layer 50 exposed by the planarization process that may be performed on the first interlayer insulating layer 70. The conductive layer 72 may be formed on the entire surface of the exposed resistance change layer 50. Then, the conductive layer 72 may be patterned to form the aforementioned bit lines as described below.

Figure 31:
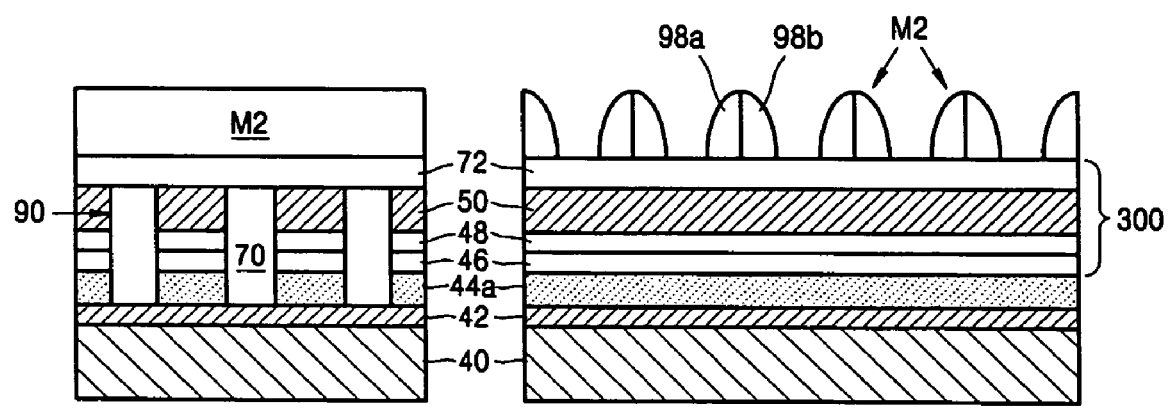

The bit line formation process will be described in more detail with reference to the example embodiment(s) of FIG. 31 of the present invention. Second mask pattern(s) M2 may be formed on a third stack structure 300 including the first semiconductor layer 46, the second semiconductor layer 48, the resistance change layer 50, and the conductive layer 72. The second mask pattern(s) M2 may be formed using the same or similar processes used for forming the first mask pattern(s) M1. Also, each of the second mask pattern(s) M2 may include the same or similar configuration elements of the first mask pattern(s) M1. That is, a third spacer 98a and a fourth spacer 98b that may be included in the second mask pattern(s) M2 may have substantially the equivalent function as that of the first spacer 58a and the second spacer 66a included in the first mask pattern(s) M1. The second mask pattern(s) M2 may perpendicularly (or substantially perpendicularly) cross the first mask pattern(s) M1. That is, the second mask pattern(s) M2 may cross in a perpendicular orientation to the patterned n+-type impurity doped semiconductor layer 44a which may be employed as the word line.

Figure 32:
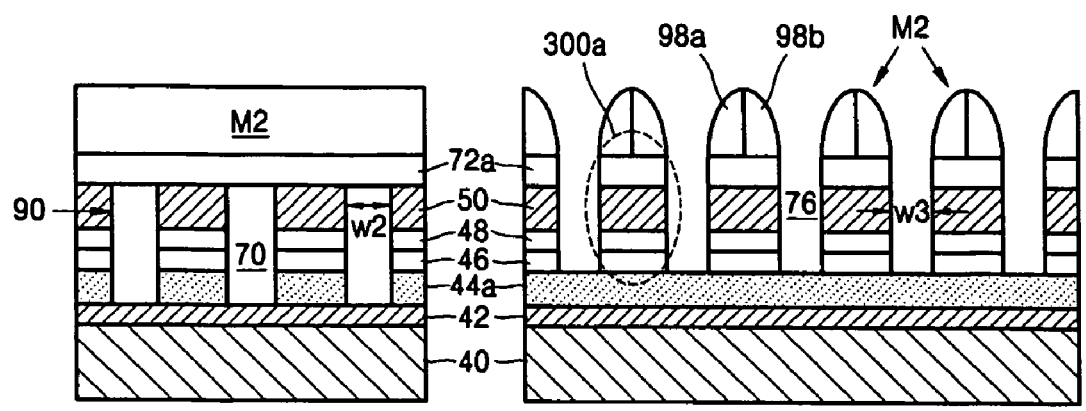

Referring to the example embodiment(s) of FIG. 32 of the present invention, identical to or similar to the formation of the second holes 90 in the second stack structure 200, a plurality of third holes 76 may be formed by patterning a third stack structure 300 including the first semiconductor layer 46, the second semiconductor layer 48, the resistance change layer 50, and the conductive layer 72 using the second mask pattern(s) M2 as an etch mask. Herein, the third holes 76 may be patterned in strip form and may expose the patterned n+-type impurity doped semiconductor layer 44a. A width "w3" of the third hole 76 may be set to be same as the width "w2" of the second hole 90. In other words, the width "w3" of the individual third hole 76 may have a value of about F/3.

Subsequently, the second mask pattern(s) M2 may be removed. The formation of the third holes 76 may cause the third stack structure 300 to be divided into a number of second stack pattern(s) 300a. Each patterned conductive layer 72a may perpendicularly cross the patterned n+-type impurity doped semiconductor layer 44a (which may be used as the word line), and the patterned conductive layer 72a may be used as a bit line. As the second stack pattern(s) 300a may be formed in strip form, the second stack structure 200 patterned in strip form during the word line formation may be divided by as much as the width "w3" of the third hole 76 in a lengthwise direction of the patterned n+-type impurity doped semiconductor layer 44a. Through such patterning, the resistance change layer 50, the first semiconductor layer 46 and the second semiconductor layer 48 may exist at regions where the patterned n+-type impurity doped semiconductor layer 44a and the patterned conductive layer 72a may perpendicularly cross with each other.

Figure 33:
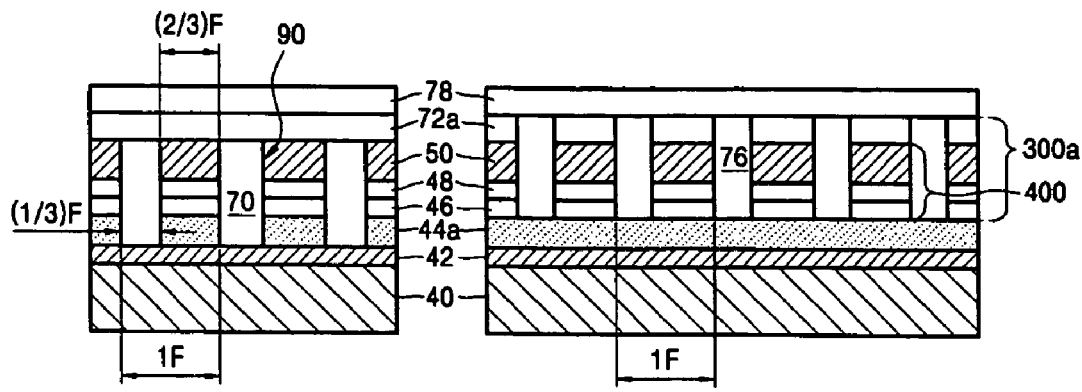

Referring to example embodiment(s) of FIG. 33 of the present invention, a reference numeral 400 defines a fourth stack structure including the resistance change layer 50, the first semiconductor layer 46 and the second semiconductor layer 48. The fourth stack structure 400 may be formed in a square shape of which both the length and width may be about (⅔)F. After the formation of the third holes 76, a second interlayer insulating layer 78 filling the third holes 76 may be formed over the second stack pattern(s) 300a. Furthermore, the non-volatile memory device illustrated in the example embodiment(s) of FIG. 33 of the present invention may be additionally formed on a resulting substrate structure as shown in FIG. 33.

Figure 34:
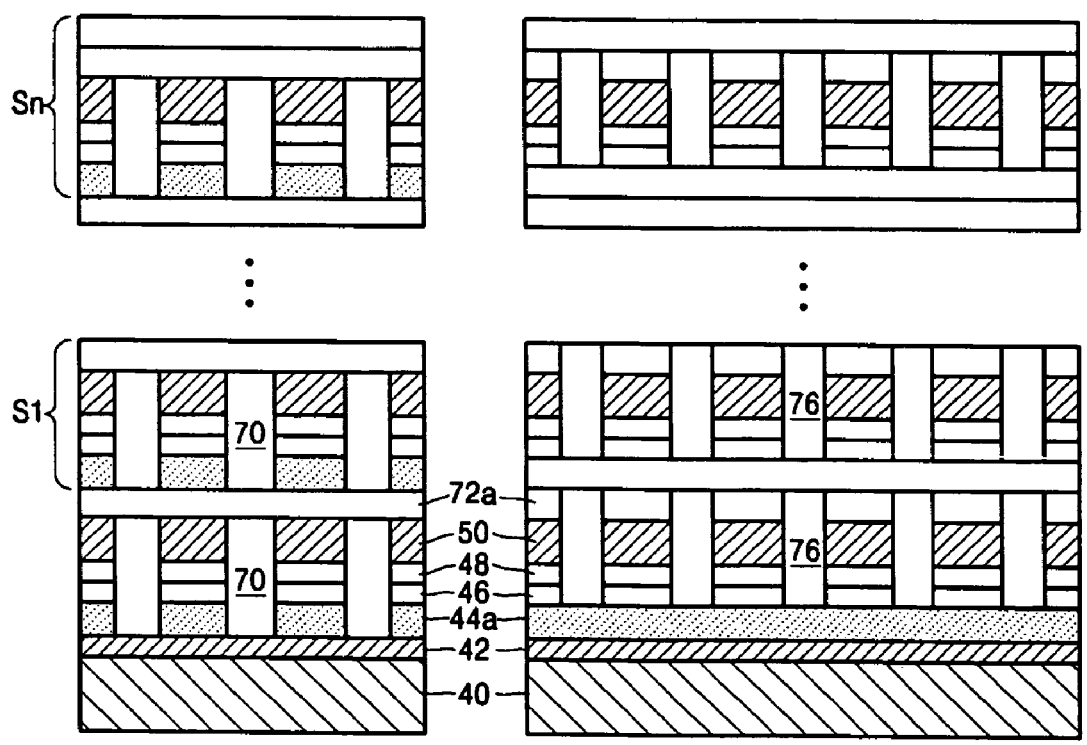

Referring to the example embodiment(s) of FIG. 34 of the present invention, the second interlayer insulating layer 78 may be planarized until the patterned conductive layer 72a may be exposed. Then, another stack structure S1 patterned in the form of strips (or other suitable shape or form) may be formed on the exposed patterned conductive layer 72a through the above-described sequential (or other suitable) processes according to example embodiment(s) of the present invention. Another stack structure may include those layers sequentially from the semiconductor layer 44a to the patterned conductive layer 72a. According to example embodiment(s) of the present invention, the sequential (or other suitable) processes may be repeated until an intended multibit memory device may be formed. An "$n^{th}$" stack structure $S_n$ patterned in strip form (or other suitable form or shape) on an uppermost layer may be formed such that the second interlayer insulating layer 78 filling the third holes 76 may exist on the a patterned conductive layer 72a.

According to example embodiment(s) of the present invention, the storage node and the spacers may be formed in an integral structure within an area of approximately $1F^2$ by employing a self-aligning method. Accordingly, the disclosed non-volatile memory device may improve the integration scale of so formed memory devices, according to example embodiment(s) of the present invention.

Although the non-volatile memory device manufacturing example embodiment(s) of the present invention including the above-noted method(s) may be described in detail, these technical descriptions are not intended to limit the scope of the present invention. For instance, those materials or other members that may be functionally equivalent to the PN diode layer may be used. Also, instead of forming the word lines first, the bit lines may be formed first followed by the word line formation according to various non-limiting example embodiment(s) of the present invention.

Although example embodiments of the present invention have been disclosed for illustrative purposes, those skilled in the art will appreciate that various modifications, additions and/or substitutions are possible, without departing from the scope and spirit of the invention as disclosed in the accompanying claims.

What is claimed is:

1. A method of manufacturing a memory device, wherein data are stored in a region at which a word line and a bit line cross each other, the method comprising the sequential steps of:
   (a) providing a data storage layer stacked on a diode layer which is stacked on a conductive material layer which is stacked on a bottom layer;
   (b) forming a first material layer on the data storage layer;
   (c) forming a first hole in the first material layer, the hole exposing the data storage layer;
   (d) forming a first spacer with a second material layer on the sidewall of the first hole;
   (e) filling the first hole with a third material layer covering the first spacer;
   (f) removing the first material layer;
   (g) forming a second spacer with a fourth material layer on the sidewall of the first spacer exposed on removal of the first material layer;
   (h) removing the third material layer, leaving the first and second spacers exposed; and
   (i) forming a second hole in a first stack structure including the conductive layer, the diode layer and the data storage layer using the first and second spacers as a mask, the second hole exposing the bottom layer.

2. The method of claim 1, wherein the bottom layer is formed by sequentially stacking a substrate and a buffer layer.

3. The method of claim 2, wherein forming the conductive material layer includes:
   forming a semiconductor layer on the buffer layer; and
   doping n+-type conductive impurities onto the semiconductor layer.

4. The method of claim 1, wherein filling the first hole further comprises:
   forming the third material layer filling the first hole on the first material layer; and
   planarizing the third material layer until the first material layer is exposed.

5. The method of claim 1, wherein forming the second spacer further comprises:
   forming the fourth material layer covering the first spacer and the third material layer on the data storage layer exposed by removal of the first material layer; and
   anisotropically etching process the upper surface of the fourth material layer until the data storage layer and the third material layer are exposed.

6. The method of claim 1, wherein forming the first spacer further comprises:
   forming the second material layer covering the sidewalls and the bottom of the first hole on the first material layer; and
   anisotropically etching the second material layer until the first material layer and the data storage layer are exposed.

7. The method of claim 1, wherein forming the first hole further comprises:
   forming a hard mask including an opening on the first material layer, the opening being patterned in the form of a strip and having a width of about 1 F; and
   etching a portion of the first material layer exposed through the opening until the data storage layer is exposed.

8. The method of claim 5, wherein the fourth material layer is formed in a thickness less than 1 F.

9. The method of claim 6, wherein the second material layer is formed in a thickness less than 1 F.

10. The method of claim 1, further comprising:
    (j) removing the first and second spacers;
    (k) filling the second holes exposing the bottom layer with a first insulation layer;
    (l) forming a conductive layer on the data storage layer and on the first insulation layer filling the second hole;
    (m) forming third and fourth spacers on the conductive layer through the operations (b) through (h), the third and fourth spacers being substantially equal to the first and second spacers, respectively and crossing perpendicular to the first and second spacers;
    (n) forming third holes in a third stack structure to form a second stack pattern including the diode layer, the data storage layer and the conductive layer using the third and fourth spacers as a mask, the third holes exposing the conductive material layer;
    (o) removing the third and fourth spacers; and
    (p) filling the third holes exposing the conductive material layer with a second insulation layer.

11. The method of claim 10, wherein in the forming the third and fourth spacers, each material layer for forming the third and fourth spacers is formed in a thickness less than about 1 F.

12. The method of claim 10, further comprising:
    (q) forming another buffer layer covering the second insulation layer on the conductive layer; and
    (r) repeating the operations (a) through (p) using the another buffer layer as the bottom layer.

13. The method of claim 1, wherein the first hole is the form of a strip.

14. The method of claim 1, wherein the second hole is the form of a strip.

* * * * *